United States Patent
Ma et al.

(10) Patent No.: US 6,806,101 B2
(45) Date of Patent: Oct. 19, 2004

(54) FERROELECTRIC CAPACITOR PLASMA CHARGING MONITOR

(75) Inventors: Shawming Ma, Sunnyvale, CA (US); Guoqiang Xing, Plano, TX (US); Stephen R. Gilbert, San Francisco, CA (US)

(73) Assignees: Texas Instruments Incorporated, Dallas, TX (US); Agilent Technologies, Palo Alto, CA (US)

( * ) Notice: Subject to any disclaimer, the term of this patent is extended or adjusted under 35 U.S.C. 154(b) by 0 days.

(21) Appl. No.: 10/422,332

(22) Filed: Apr. 24, 2003

(65) Prior Publication Data

US 2003/0197167 A1 Oct. 23, 2003

Related U.S. Application Data

(62) Division of application No. 10/036,799, filed on Dec. 21, 2001, now Pat. No. 6,576,922.

(51) Int. Cl.$^7$ .............................................. G01R 31/26
(52) U.S. Cl. .......................................... 438/11; 438/18
(58) Field of Search ................................ 438/3, 11, 17, 438/18

(56) References Cited

U.S. PATENT DOCUMENTS

| 5,315,145 | A | | 5/1994 | Lukaszek |
| 5,781,445 | A | | 7/1998 | Shiue et al. |
| 5,869,877 | A | * | 2/1999 | Patrick et al. ............... 257/429 |
| 5,959,309 | A | | 9/1999 | Tsui et al. |
| 5,963,412 | A | | 10/1999 | En |
| 6,159,864 | A | * | 12/2000 | Wang et al. ................. 438/723 |
| 6,265,729 | B1 | | 7/2001 | Nelson et al. |
| 6,582,977 | B1 | * | 6/2003 | Rodriguez et al. ............ 438/14 |
| 6,586,765 | B2 | * | 7/2003 | Lin et al. ....................... 257/48 |
| 6,600,185 | B1 | * | 7/2003 | Tani et al. .................. 257/296 |

* cited by examiner

*Primary Examiner*—Long Pham
*Assistant Examiner*—(Vikki) Hoa. B. Trinh
(74) *Attorney, Agent, or Firm*—Jacqueline J. Garner; W. James Brady, III; Frederick J. Telecky, Jr.

(57) ABSTRACT

Plasma charging devices and methods are disclosed for detecting plasma charging during semiconductor wafer processing. Charging monitors are disclosed having ferroelectric capacitance elements which can be preprogrammed prior to processing steps of interest, and then subsequently measured afterwards, in order to determine whether plasma related charging is a problem in the intervening processing steps.

16 Claims, 14 Drawing Sheets

FERROELECTRIC CAPACITOR PLASMA CHARGING MONITOR

This is a divisional application of Ser. No. 10/036,799 filed Dec. 21, 2001 now U.S. Pat. No. 6,576,922.

FIELD OF INVENTION

The present invention relates generally to the art of semiconductor devices and more particularly to methods and apparatus for monitoring plasma charging during semiconductor processing.

BACKGROUND OF THE INVENTION

In the course of manufacturing semiconductor devices, certain processing steps involve the use of electrically charged plasma. Ion implantation, plasma etching, and other charged processing steps may damage semiconductor wafers, and the devices and circuits thereof. For instance, plasma dry etching operations employ an electrically excited gas etchant, where the surface to be etched is coated with a patterned layer of photoresist and then exposed to a gaseous plasma of the gas. Plasma dry etching is often used for controlled etching of high density features and is generally anisotropic, whereas wet etching techniques are commonly used to remove large volumes of material, being generally isotropic. Despite having certain advantages in many applications where anisotropic etching is desired, plasma etching can cause charge accumulation in semiconductor wafer workpieces being etched. The plasma is made up of a mix of charged particles, and there is a tendency for some such charged particles to accumulate on the wafer surface through what is sometimes referred to as the antenna effect.

This charge accumulation can lead to damage of transistors, gates, circuits, and other structures in the finished product. For example, plasma related charging can result where there are large antennas of conducting material such as metal or polysilicon in the workpiece, which may be electrically connected to transistor gates with thin gate oxide. Such antennas may collect a relatively high level of electrical charge by virtue of their large areas during plasma based processing operations. The collected charge may then be conducted through circuit paths in the wafer due to a voltage potential developed between the wafer surface and the underlying substrate material. This charge may thus be conducted to transistors or other devices in the wafer, resulting in performance degradation and/or damage thereto.

Various devices have thusfar been developed to measure the resulting voltage potential (or a current flow) between a charge collection area on the surface of the semiconductor device wafer and the substrate of the semiconductor wafer. Such devices include monitors or sensors located proximate the wafer workpieces during implantation or other processing steps involving plasma, which provide sensor signals to control systems or user interface devices. The actual charging of the semiconductor wafer is then inferred from the sensor signal. Other plasma charging measurement devices have been developed, which are formed directly in the wafer workpieces or in dedicated test wafers. These in-situ plasma charging sensors typically consist of dedicated memory cells, such as one or more electrically erasable programmable read only memory (EEPROM) cells formed in the wafer. For example, one or more such EEPROM memory cells may be provided, having a stacked gate MOS type transistor operating as voltage or current sensor.

In such memory type detector devices, a charge collection electrode is located on the top of the wafer, and is associated with the control gate of a stacked gate MOS type transistor, so as to collect plasma related charge during processing, which in turn affects the transistor gate. As plasma related charge is collected at the wafer surface, the transistor based memory cell measures the resulting voltage potential between the charge collection electrode and the wafer substrate. The voltage potential in the wafer, in turn changes the threshold voltage Vt of the memory cell, and hence the threshold voltage Vt thereof can be measured before and after a plasma related processing step. A comparison of the threshold voltage measurements is then used to estimate the plasma charging associated with the processing step. For instance, the threshold voltage shift of the sensing transistor may be used to calculate the plasma charging voltage during plasma processing.

More than one such charge monitoring devices are typically provided to monitor the wafer during fabrication and processing. A first or initial threshold voltage is programmed prior to exposing the wafer to a plasma related process, typically by probing the wafer and providing a known programming signal to the transistor via the charge collection electrode. At this point, the actual initial threshold voltage is sometimes measured or verified, prior to performing wafer processing steps involving plasma. After the processing step or steps of interest, the EEPROM transistor is probed and a second or final threshold voltage is measured. Once the initial and final threshold voltages are determined, then the surface potential related to the plasma can be estimated using a calibration curve or plot of threshold voltage shift versus gate voltage for the EEPROM transistor. In this regard, the estimated gate voltage represents the voltage potential between the charge collection electrode at the wafer surface and the wafer substrate. Where a resistance of known value is provided between the charge collection electrode and the substrate, then the plasma processing related current can be determined according to the gate voltage and the known resistance value. In this fashion, EEPROM transistor-based charge detection devices can be used to estimate the plasma related charging of a particular processing step.

However, these devices suffer from several shortcomings. For example, EEPROM memory cell type charging sensors are limited to detecting voltage, for example, in a range of about −25 to +30 volts. Consequently, these EEPROM type monitor devices are unable to quantify or measure plasma related potentials above this range. Furthermore, the threshold voltage of the EEPROM cell type detectors is sensitive to ultra-violet (UV) radiation. As a result, the threshold voltage shift represents both plasma process related charging and exposure of the wafer to UV sources during processing. Thus, it may be difficult or impossible to differentiate between the two in order to accurately quantify the plasma charging in the manufacturing process. Moreover, the construction of EEPROM memory cells is relatively complex, requiring the formation in the wafer of the source, drain, and gate structures of the MOS type transistor, thereby making the manufacturing process more difficult. Thus, there is a need for improved plasma charging monitor devices and methodologies by which plasma charging effects in semiconductor device manufacturing processes can be characterized, without the UV sensitivity and voltage range limitations associated with prior insitu and other charging sensors.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of the summary is to present some concepts of the invention in a simplified form as a prelude to the more detailed description that is presented later.

The invention relates to apparatus and methods for monitoring plasma related charging in a semiconductor wafer, by which the above mentioned and other shortcomings associated with the prior art may be mitigated or avoided. Ferroelectric (FE) capacitor plasma charging monitor devices are provided, which are relatively simple to design and fabricate in production and/or test wafers, and which do not suffer from the UV sensitivity problems associated with EEPROM type insitu monitors. In addition, the FE sensor devices are not limited by the voltage detection ranges achievable in prior transistor-based memory cell charging sensors. The invention can thus be employed to quantify plasma processing related charging effects associated with process steps, including for example, resist ashing operations, dielectric deposition operations, such as using plasma enhanced chemical vapor deposition (PECVD), metal or dielectric etch operations, such as dry plasma etching, implantation operations, and other process steps in which plasma is employed.

One aspect of the present invention relates to plasma charging monitors, comprising a ferroelectric (FE) capacitor formed in a semiconductor wafer between the top surface and the underlying substrate, an exposed conductive antenna, which is connected to a first or upper terminal or electrode of the FE capacitor, and a conductive probe pad connected to the other (e.g., lower) capacitor electrode. Ferroelectric materials exhibit electric polarization behavior, wherein the polarity can be reversed by application of a suitable electric field, such as by applying a voltage potential between the antenna and the wafer substrate material. Once a ferroelectric capacitor device is preprogrammed to a first polarity, application of a switching voltage value of opposite polarity will cause the capacitor polarity to change. Otherwise, once the external voltage is removed, the capacitor polarity returns to its original (e.g., preprogrammed) state. The sizes and configurations of the FE capacitor, the antenna, and resistances in the resulting series circuit can be selected so as to provide a desired switching voltage for the plasma charging monitor. The FE capacitor type plasma charging apparatus of the invention can thus be preprogrammed to a first polarity, and measured after intervening process steps, to ascertain if the charging related to the process steps exceeded the switching voltage for the monitor.

Ferroelectric materials can display a wide range of dielectric, ferroelectric, piezoelectric, electrostrictive, pyroelectric and electro-optical properties, and are similar to ferromagnetic materials in certain respects, such as regarding spontaneous polarization. The FE capacitor may be formed, for example, through metal organic chemical vapor deposition (MOCVD) using ferroelectric thin films such as Pb(Zr,Ti)O3 (PZT), (Ba,Sr)TiO3 (BST), SrTiO3 (STO) and SrBi2Ta2O9 (SBT), BaTiO3 (BTO), (Bi1-xLax) 4Ti3O12 (BLT), or other ferroelectric material formed between two conductive electrodes in the semiconductor wafer. A resistor may be provided between the antenna and the capacitor, such as using doped polysilicon, in order to facilitate design of the series circuit for charging monitoring. The FE type capacitor may be preprogrammed via the antenna and the probe pad using an external instrument, for example, a voltage source, such that the FE capacitor attains a preprogrammed polarity. One or more processing steps are then performed, and the polarity of the FE capacitor is measured. A change in the FE capacitor polarity will thus indicate that wafer charging during the intervening processing step or steps exceeded a known value.

One or more such devices may be formed in the wafer, individually having different predetermined resistance values, capacitor sizes, and/or different antenna sizes. In this manner, plasma related charging during processing may cause polarity changes in some FE capacitors, and no polarity change in others. Knowing the circuit component values (e.g., resistances) for the devices experiencing a polarity change, and for those that did not, allows a determination of the plasma related charging voltage and/or current during processing. Polarity changes in individual devices can thus be indicative of plasma related charging above a certain level, and multiple devices associated with different predetermined levels can be used to provide an estimate of the charging current and/or voltage.

Because the FE type capacitor monitors are relatively insensitive to UV exposure, the polarity changes (e.g., or lack of polarity changes) therein are directly indicative of plasma charging exposure, regardless of any intervening UV experienced by the wafer. Furthermore, the FE capacitor type monitor devices according to the present invention do not suffer from the voltage range limitations of memory cell type devices. Moreover, the FE capacitor based charging monitor devices are simpler and easier to construct than EEPROM memory cell based monitor devices, which require formation of transistor drain/source regions, and gate structures in a wafer. The invention further provides techniques for making plasma charging monitors using FE capacitors in a semiconductor wafer.

Another aspect of the invention provides methods of monitoring plasma related charging in a semiconductor wafer, which mitigate the problems encountered with prior techniques. A ferroelectric capacitor in a semiconductor wafer is preprogrammed prior to performing a processing operation on the wafer. A post processing polarity associated with the FE capacitor is then measured, and plasma related charging associated with the processing operation is determined or estimated according to the measured polarity. For instance, a change in the FE capacitor polarity may indicate that wafer charging during the intervening processing exceeded a known value. The FE capacitor may be preprogrammed and subsequently measured by connection of external instrumentation (e.g., preprogramming sources and polarity detection devices, respectively) using probe points connected to the FE capacitor, one of which may be an exposed conductive antenna at the top surface of the wafer.

Preprogramming the capacitor may involve applying a voltage across the probe points so as to charge the ferroelectric capacitor to a first polarity. Subsequent to processing, a measurement instrument, such as a volt meter, can be connected across the probe points or pads, to measure the voltage polarity of the FE capacitor. If the post-processing capacitor polarity is different from the preprogrammed polarity, it can be discerned that the plasma charging exceeded a threshold value (e.g., current or voltage) corresponding to the physics of the charging monitor. If no polarity change is detected, it can be presumed that the plasma charging did not reach this threshold value. More than one such FE capacitor can be preprogrammed and subsequently measured, where a value of plasma charging current or voltage can be determined by comparing the polarity changes (e.g., or lack of polarity changes) in different FE capacitors, such as where different resistance values and/or different size antennas are associated with different FE capacitors.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
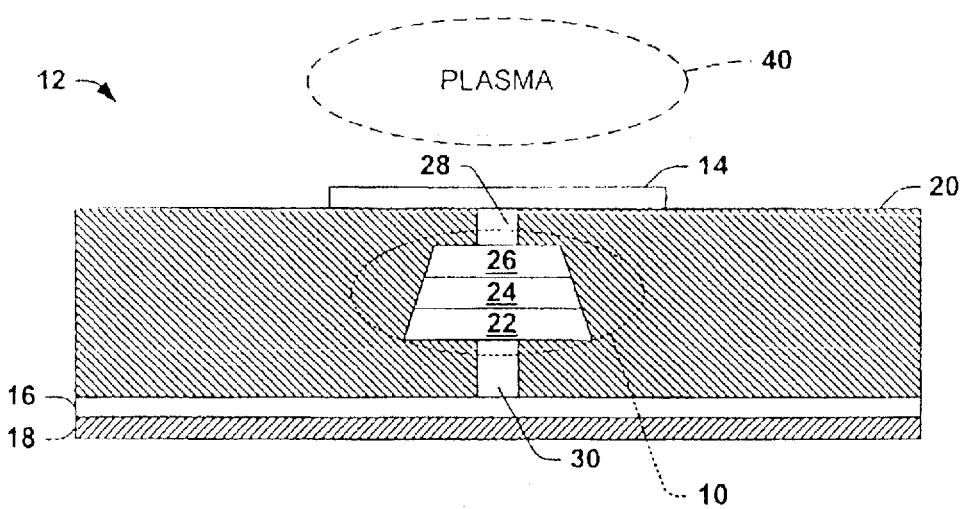
FIG. 1 is a side elevation view in section, schematically illustrating an exemplary ferroelectric (FE) capacitor and a connected antenna in a semiconductor wafer, where electrical charge from a plasma proximate the wafer causes charging of the FE capacitor.

The present invention will now be described with reference to the attached drawings, wherein like reference numerals are used to refer to like elements throughout. The invention relates to insitu devices and methods for plasma charging monitoring in semiconductor wafers. Exemplary implementations of the various aspects of the invention are hereinafter illustrated and described in relation to one or more plasma related processing operations. However, it will be appreciated that the invention finds utility in association with measuring wafer charging in association with other plasma related operations, and operations not involving plasma, where charge accumulation occurs during wafer processing. In addition, one or more aspects of the invention may be implemented in structures and techniques apart from those specifically illustrated and/or described herein.

Referring initially to FIG. 1, a ferroelectric (FE) capacitor 10 is illustrated in a semiconductor wafer 12, extending vertically between a conductive antenna structure 14, such as metal, at the top surface of the wafer 12 and a lower conductive metal layer 16 overlying a substrate 18 of the wafer 12, wherein the various layers and structures are not necessarily shown to scale. The FE capacitor 10 is laterally surrounded by an insulator material 20, such as silicon dioxide ($SiO_2$) upon which the antenna 14 is formed, and comprises a bottom conductive electrode 22, a ferroelectric material 24 overlying the bottom electrode 22, and a top conductive electrode 26 overlying the ferroelectric material 24 on the wafer 12. In the example of FIG. 1, a conductive upper conductive material 28 extends between and connects the top electrode 26 and the antenna 14, and a lower conductive material 30 extends between and connects the bottom electrode 22 and the lower conductive metal layer 16.

The capacitor 10 is thus vertically disposed between the upper surface of the wafer 12, and the substrate 18 thereof, forming a capacitor charging circuit wherein the resistance of the antenna 14 and the upper and lower conductive materials 28 and 30, respectively are serially connected with the FE capacitor 10 between the upper surface of the wafer 12 and the substrate 18. As the wafer 12 is processed using a plasma 40 (e.g., such as during etching, deposition, resist ashing, implantation, etc.), charged particles therefrom (not shown) may accumulate on the upper wafer surface, particularly on the antenna 14, resulting in a voltage potential between antenna 14 and the wafer substrate 18. If this voltage potential exceeds the switching voltage of the FE capacitor 10, the capacitor 10 acquires a corresponding polarity, which is retained after the plasma induced voltage potential is removed. In this regard, it will be appreciated that depending upon the type of plasma 40, positive or negatively charged particles may accumulate on the antenna 14, and that the resulting voltage potential between the antenna 14 of the top surface of the wafer 12 and the underlying substrate material 18 may be of positive or negative polarity. Consequently, the resulting polarity of the FE capacitor 10 will correspond to the polarity of the antenna to substrate voltage potential (e.g., where the potential exceeds the switching voltage of the FE capacitor 10) resulting from the accumulated charge.

Figure 2:
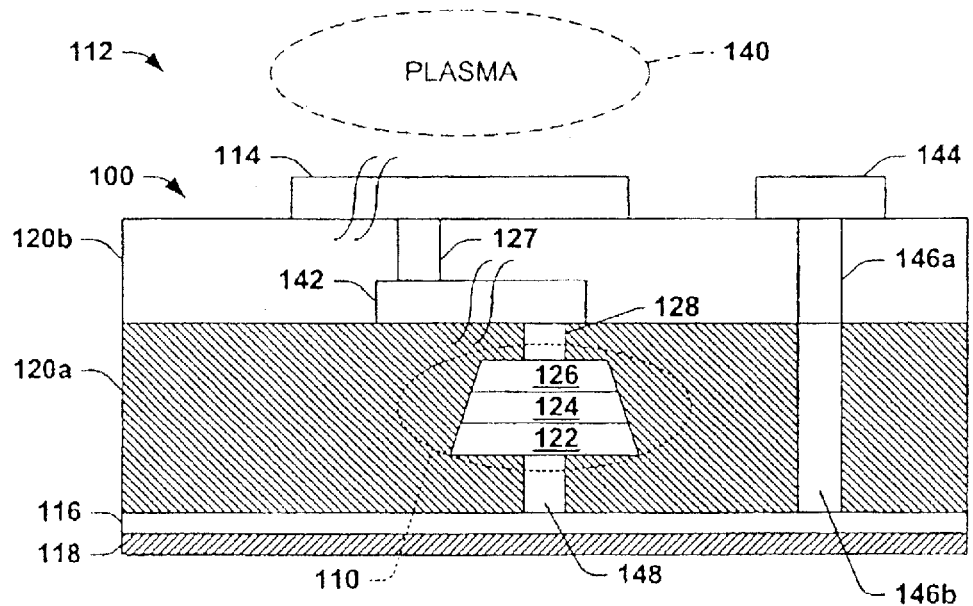
FIG. 2 is a side elevation view in section, illustrating an exemplary ferroelectric capacitor plasma charging monitor formed in a semiconductor wafer in accordance with one or more aspects of the present invention.

In FIG. 2, an exemplary plasma charging monitor 100 is formed in a semiconductor wafer 112 for monitoring charging related to a plasma 140 proximate the wafer 112 during fabrication or processing thereof. The wafer 112 may be a production wafer or a dedicated test wafer used to evaluate plasma charging associated with one or more semiconductor processing steps during manufacturing. According to an aspect of the present invention, the plasma charging monitor 100 comprises a ferroelectric (FE) capacitor 110 formed in the wafer 112, which has a bottom conductive electrode 122, a ferroelectric material 124 overlying the bottom electrode 122, and a top conductive electrode 126 overlying the ferroelectric material 124. The ferroelectric portion 124 of the FE capacitor 110 may be comprised of any suitable ferroelectric material, such as Pb(Zr,Ti)O3 (e.g., PZT), (Ba,Sr)TiO3 (e.g., BST), SrTiO3 (e3.g., STO) and SrBi2Ta2O9 (e.g., SBT), BaTiO3 (BTO), (Bi1-xLax)4Ti3O12 (BLT), or other ferroelectric material formed between the conductive electrodes 122 and 126 in the semiconductor wafer 112.

A conductive antenna 114 is formed in the semiconductor wafer 112, wherein at least a portion of the antenna 114 is exposed so as to allow connection to external instruments, as illustrated and described further hereinafter with respect to FIGS. 5 and 6. A resistor 142 is formed in the semiconductor wafer 112, which electrically connects the top electrode 126 to the antenna 114 via upper and lower vertical conductive portions 127 and 128, respectively, wherein the resistor 142 may be formed in the wafer 112 using any appropriate material, such as polysilicon. A conductive metal layer 116 overlies a substrate 118, and one or more layers 120a, 120b of insulator material (e.g., such as may be formed of silicon dioxide SiO$_2$) surround the capacitor 110 and resistor 142, wherein the insulator layer 120a overlies the metal layer 116 in the wafer 112. A conductive probe pad 144 is formed in the semiconductor wafer 112, which is electrically connected to the bottom conductive electrode 122 via a first vertically extending conductive plug 146 having upper and lower portions 146a and 146b, respectively, the metal layer 116, and a second conductive plug 148 extending between the metal layer 116 and the bottom electrode 122. As with the antenna 114, all or a portion of the probe pad 144 is exposed so as to allow connection to external instruments. The structural components illustrated in FIG. 2 may be formed in the wafer 112 using any appropriate fabrication steps, and are not necessarily shown to scale.

Figure 3:
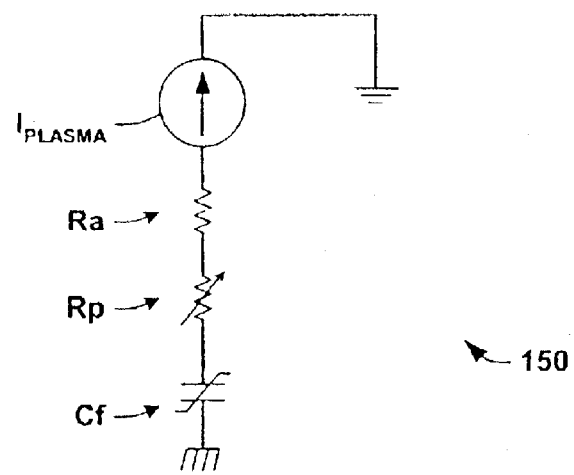
FIG. 3 is a schematic diagram illustrating a simplified circuit for the exemplary plasma charging monitor of FIG. 2.
Figure 4:
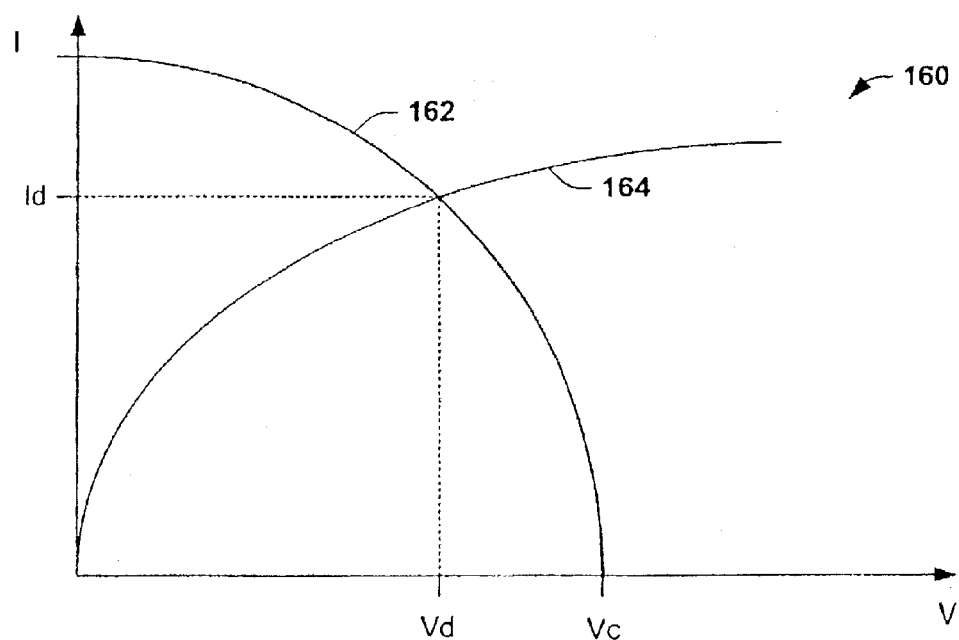
FIG. 4 is a graph illustrating exemplary current versus voltage curves for a processing plasma and an FE capacitor.

Referring also to FIGS. 3 and 4, the capacitor 110, antenna 114, and resistor 142 thus form a plasma charging monitor circuit 100, wherein the resistances of the antenna 114 and the polysilicon resistor 142 are serially connected with the capacitor 110 between the upper surface of the wafer 112 and the substrate 118. As the wafer 112 is processed using the plasma 140 (e.g., such as during etching, deposition, resist ashing, implantation, etc.), charged particles therefrom may accumulate on the upper wafer surface including the antenna 114, creating a voltage potential between antenna 114 and the substrate 118. If the resulting voltage across the FE capacitor 110 exceeds the switching voltage thereof, the FE capacitor 110 acquires a corresponding polarity, which is retained after the plasma induced voltage potential is removed.

FIG. 3 schematically illustrates a simplified charging circuit 150 for the plasma charging monitor 100 of FIG. 2. The plasma 140 causes a current $I_{PLASMA}$ to flow between the upper surface of the wafer 112 and the substrate 118 in the monitor 100, which may be of positive or negative polarity, depending upon the particular plasma 140 employed in processing the wafer 112. The resistances of the antenna 114 and the polysilicon resistor 142 are represented in the circuit 150 as Ra and Rp, respectively, and the FE capacitor 110 is represented as a capacitance Cf. Although the current source $I_{PLASMA}$ is illustrated in FIG. 3 as flowing out of the FE capacitor 110 and into the polysilicon resistor 142 (e.g., Rp), the direction of plasma current flow within the components of the charging monitor 100 will vary depending on the polarity of charge accumulating on the surface of the wafer 112.

FIG. 4 illustrates a plot 160 of exemplary current versus voltage (I–V) curves 162 and 164 for the plasma current $I_{PLASMA}$ as a function of voltage, and for the switching current as a function of voltage for the FE capacitor 110. As is known, ferroelectric materials exhibit electric polarization behavior, wherein the polarity of the FE capacitor 110 can be reversed by application of a suitable electric field, characterized as the "switching voltage" for the capacitor 110. Once the FE capacitor device 110 is preprogrammed to a first polarity, application of a switching voltage value of opposite polarity will cause the capacitor polarity to change. Otherwise, once the external voltage is removed, the capacitor polarity returns to its original (e.g., preprogrammed) polarity state.

The curve 162 illustrates the switching current vs. switching voltage for an exemplary FE capacitor (e.g., such as capacitor 110). The intersection of the curves 162 and 164 establishes a detection voltage value Vd for the plasma charging monitor 100, above which the polarity of the FE capacitor 110 will change during plasma processing of the wafer 112, wherein the detection voltage Vd corresponds to a detection current Id. Thus, for a given range of plasma charging, the size of the FE capacitor 110 can be selected so as to ensure polarity switching for the charging of interest. In addition, other components of the monitor device 100 can be sized according to a target charging threshold for a given application. For example, the sizing of the FE capacitor 110, the polysilicon resistor 142 and/or the antenna 114 can be selected so as to set the plasma charging monitor device 100 to change polarity for a given plasma voltage or plasma current level.

Figure 5:
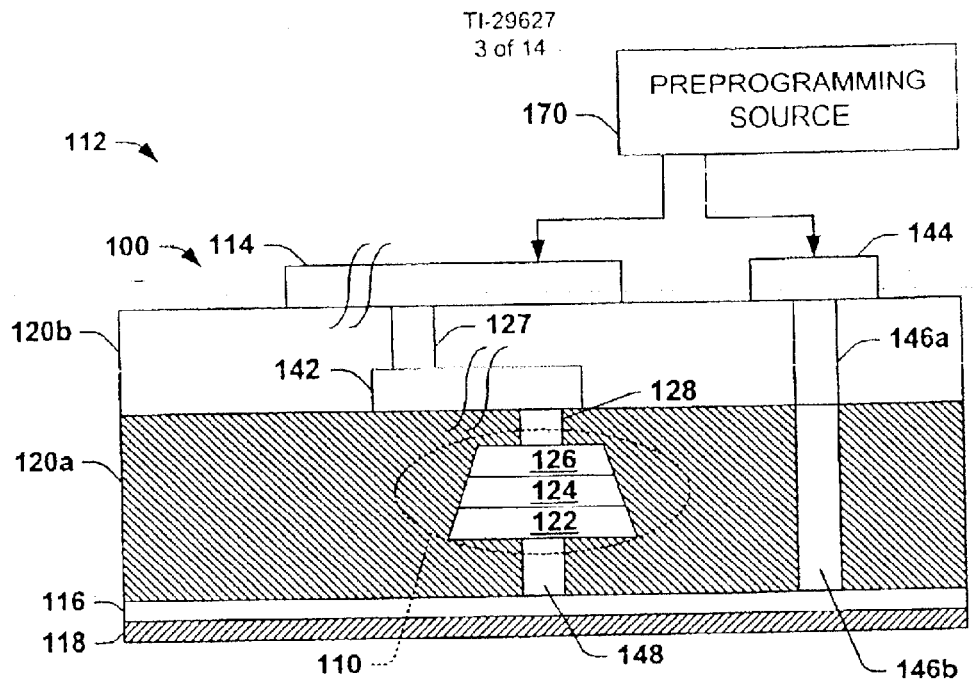
FIG. 5 is a side elevation view in section, illustrating preprogramming of the ferroelectric capacitor plasma charging monitor of FIG. 2 prior to performance of a semiconductor processing operation.
Figure 6:
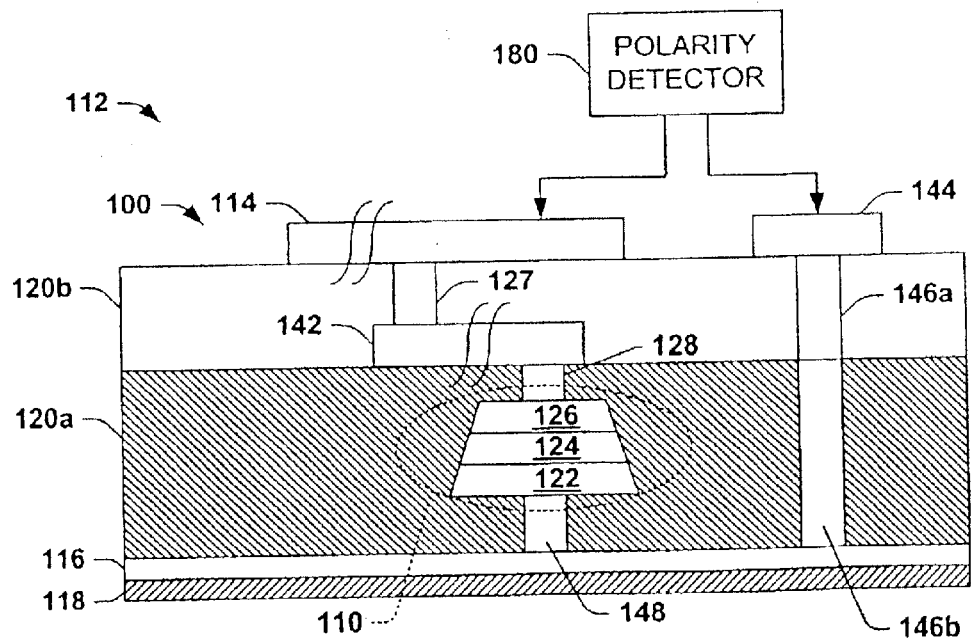
FIG. 6 is a side elevation view in section, illustrating measurement of a polarity associated with the ferroelectric capacitor plasma charging monitor of FIG. 2 following a semiconductor processing operation.

Referring also to FIGS. 5 and 6, the FE capacitor 110 of the plasma charging monitor device 100 may be preprogrammed via the antenna 114 and the probe pad 144 using an external instrument such as a preprogramming voltage source 170, such that the FE capacitor 110 attains a preprogrammed polarity. Depending upon the nature of the plasma in the process of interest, the capacitor 110 can be programmed to a positive or negative polarity. One or more processing steps are then performed, and the polarity of the FE capacitor 110 is measured via connection of a polarity detector 180 using the antenna 114 and the probe pad 144 as illustrated in FIG. 6. A change in the polarity of the FE capacitor 110 will thus indicate that wafer charging during the intervening processing step or steps exceeded a known value (e.g., the voltage across the FE capacitor 110 exceeded the switching voltage thereof). Furthermore, one or more plasma charging monitor devices 100 may be formed in the wafer 112, individually having predetermined capacitor sizes, resistance values, and/or different antenna sizes, by which each device is made to change polarity at a different plasma current or voltage level.

In this manner, plasma related charging during processing may cause polarity changes in some FE capacitors 110, and no polarity change in others. Knowing the switching voltages, for the FE capacitors experiencing a polarity change, and for those that did not, along with the resistances of the polysilicon resistor 142 and antenna 114 allows a determination of the plasma related charging voltage and/or current during processing of the wafer 112. Polarity changes in individual devices 100 can thus be indicative of plasma related charging above a certain level, and multiple devices 100 associated with different predetermined threshold detection levels can be used to provide an estimate of the charging current and/or voltage. Because the FE capacitor type charging monitor 100 is relatively insensitive to UV exposure, the polarity change (e.g., or lack of polarity change) in the capacitor 110 is directly indicative of plasma charging exposure of the wafer 112, regardless of any intervening UV exposure. Moreover, the FE capacitor based charging monitor device 100 is simpler and easier to construct than EEPROM memory cell based monitor devices.

The exemplary plasma charging monitor 100 of FIG. 2 may be employed in sensing plasma charging in association with a variety of plasma related semiconductor processing operations, such as an implantation operation, a resist ashing operation, a dielectric deposition operation, a dielectric etch operation and a metal etch operation on the semiconductor wafer 112. For instance, the device 100 may be preprogrammed to a first polarity (e.g., as illustrated in FIG. 5), such as by applying a voltage across the antenna 114 and the probe pad 144 using the preprogramming source 170 prior to performance of one or more processing steps or operations of interest in a semiconductor manufacturing process. Once the processing step or steps are finished, the polarity of the FE capacitor is measured (e.g., as illustrated in FIG. 6 using a polarity detector device 180, such as a volt meter), and the plasma related charging associated with the processing operation is determined according to the measured polarity, for instance, according to whether a polarity change occurred.

Several applications of the exemplary plasma charging monitor 100 are hereinafter illustrated and described with respect to FIGS. 7–16. However, it will be appreciated that the plasma charging monitor 100 and other such devices within the scope of the invention may be advantageously employed in monitoring or estimating charging in association with other plasma related processing steps, as well as other process steps (e.g., including those not employing plasma) which involve accumulation of charge in a semiconductor wafer 112. For example, referring to FIG. 7, the polarity of the FE capacitor 110 is preprogrammed using the antenna 114 and the probe pad 144 (e.g., as shown in FIG. 5), after which a resisting ashing operation 200 is performed on the wafer 112 to remove photoresist 202.

Figures 7, 8:
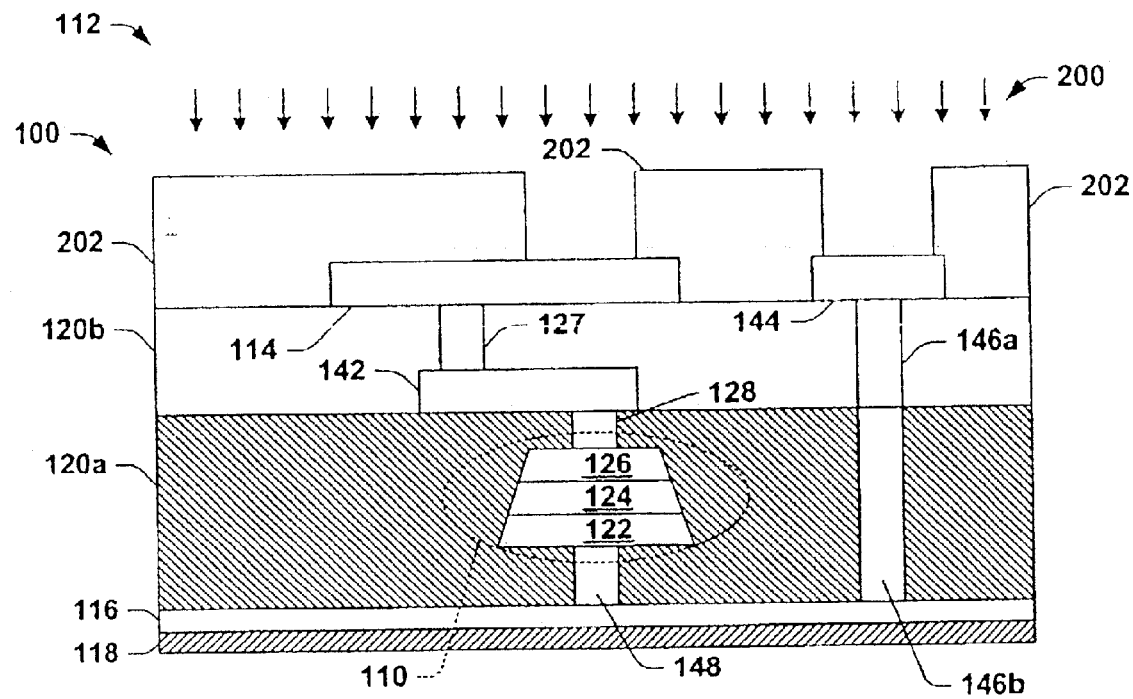
FIG. 7 is a side elevation view in section, illustrating performance of a resist ashing operation on the wafer of FIG. 2.
FIG. 8 is a side elevation view in section, illustrating the wafer of FIG. 7 following the resist ashing operation.

FIG. 8 illustrates the wafer 112 following completion of the resist ashing operation 200, by which the resist 202 of FIG. 7 has been removed through exposure of the wafer 112 to a plasma (not shown). The wafer 112 is then measured, such as illustrated in FIG. 6, whereby the post processing polarity of the FE capacitor 110 is determined. Depending upon whether the polarity of the capacitor 110 has changed as a result of the resist ashing process 200, a determination can be made as to whether the charging (e.g., plasma current or voltage potential) resulting therefrom exceeded a predetermined level. For instance, where the polarity of the FE capacitor 110 changed during resist ashing 200, it is known that the voltage across the capacitor 110 exceeded the switching voltage thereof. Knowing the switching voltage, as well as the resistances of the antenna 114 and the polysilicon resistor 142 allows a computation of the current threshold exceeded during the ashing process 200. Based on this determination, adjustments in the process 200 or other manufacturing actions can be taken to prevent or minimize damage to production wafers undergoing the processing step 200.

Figure 9:
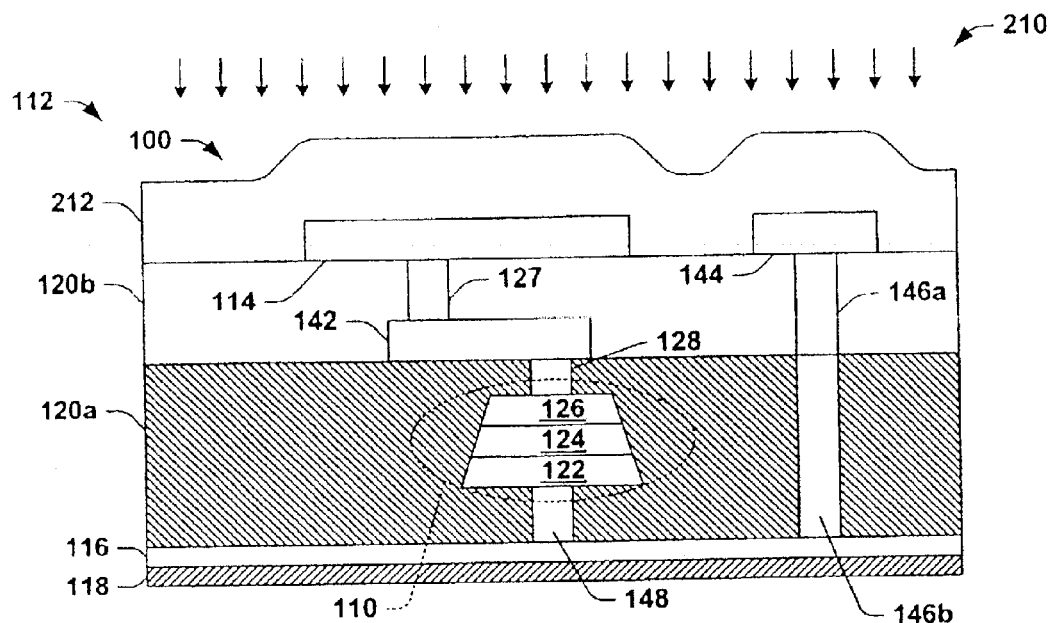
FIG. 9 is a side elevation view in section, illustrating deposition of a dielectric layer over the wafer of FIG. 2.
Figure 10:
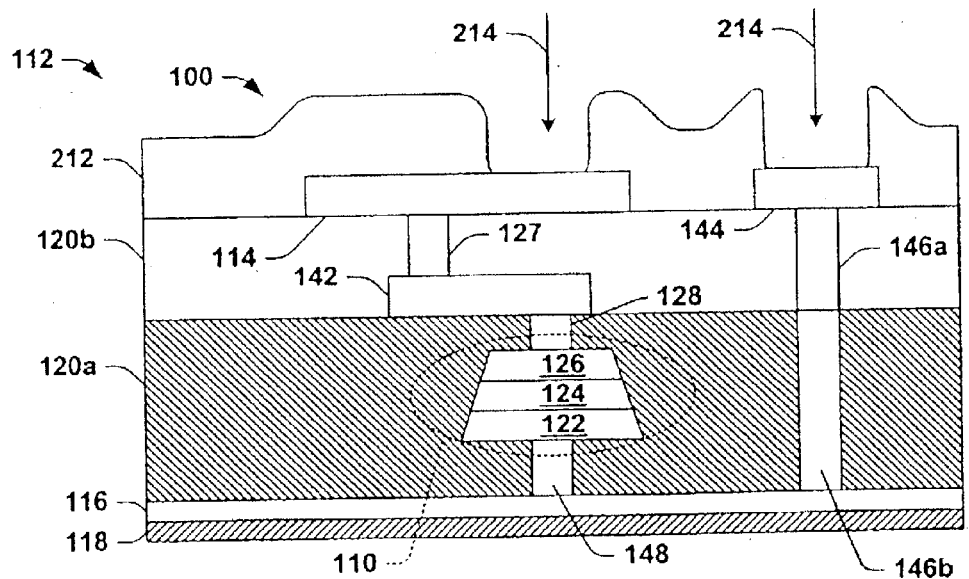
FIG. 10 is side elevation view in section, illustrating a wet dielectric etch operation on the wafer of FIG. 9 exposing portions of the antenna and probe pad for measurement of the FE capacitor polarity.

In FIGS. 9 and 10, the exemplary plasma charging monitor 100 is employed to characterize or monitor the plasma charging resulting from a dielectric deposition operation. Where such deposition operation includes plasma or other charging sources, the invention can be used to quantify or monitor such charging, for instance, wherein one or more such monitors 100 are formed in a production or test wafer 112. Beginning with the wafer 112 as shown in FIG. 2, a dielectric deposition operation 210 is performed, by which a dielectric layer 212 is formed on the top surface of the wafer 112. Thereafter, as illustrated in FIG. 10, a patterned wet dielectric etch operation 214 is performed on the semiconductor wafer 112 (e.g., using appropriate resist and patterning lithography, not shown) to remove dielectric material in order to expose portions of the antenna 114 and the probe pad 144. Thereafter, the polarity of the FE capacitor 110 is measured (e.g., FIG. 6) to determine whether the charging associated with the dielectric deposition process 210 exceeded the threshold value determined by the components in the plasma charging monitor 100.

Figure 11:
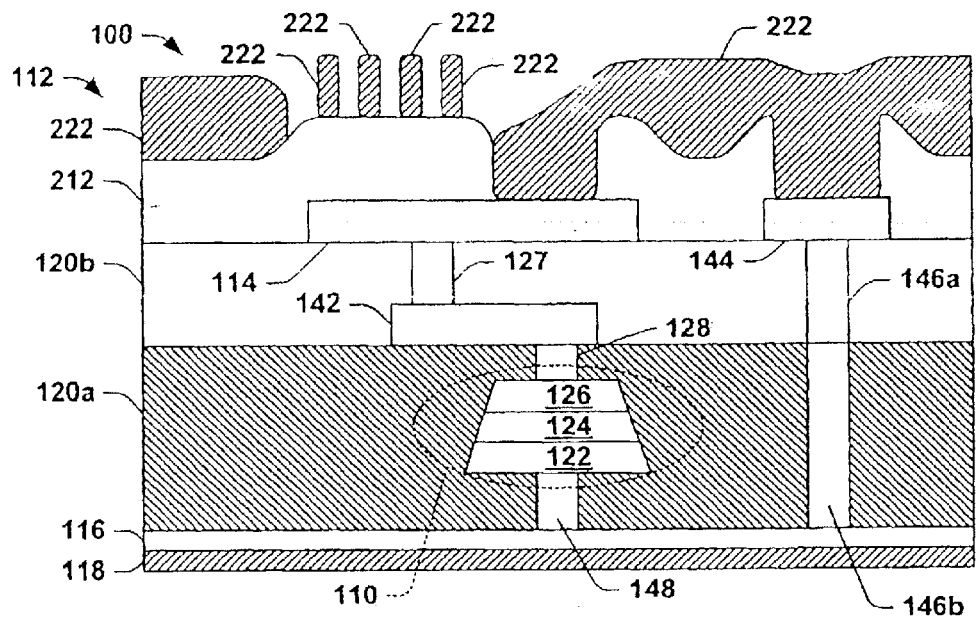
FIG. 11 is side elevation view in section, illustrating patterned resist on the wafer of FIG. 10.
Figure 12:
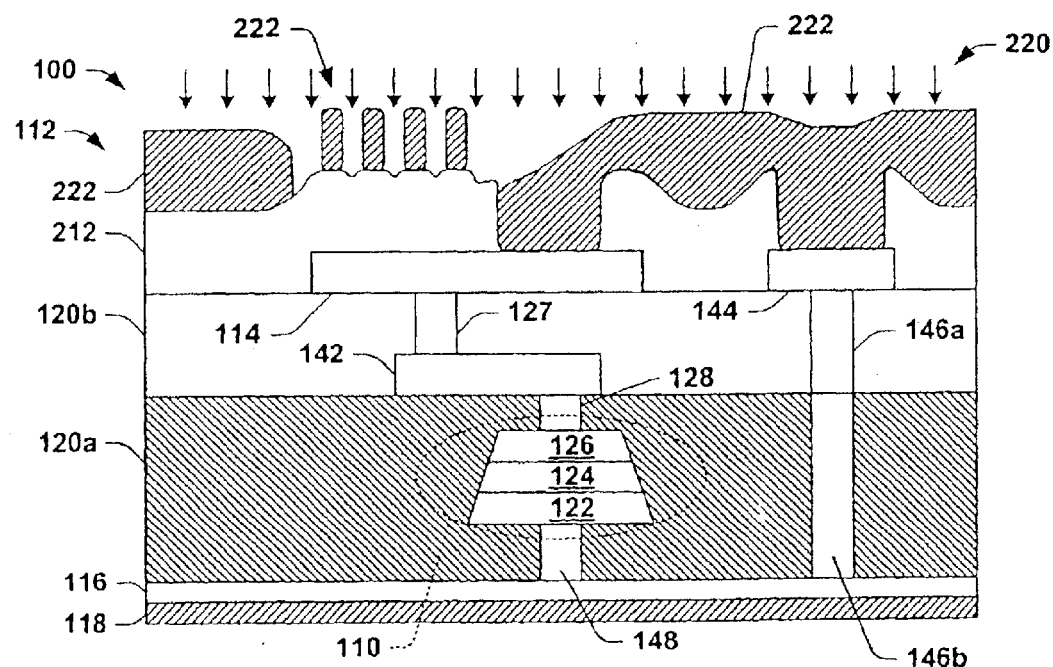
FIG. 12 is side elevation view in section, illustrating a dielectric etching operation on the wafer of FIG. 11.
Figure 13:
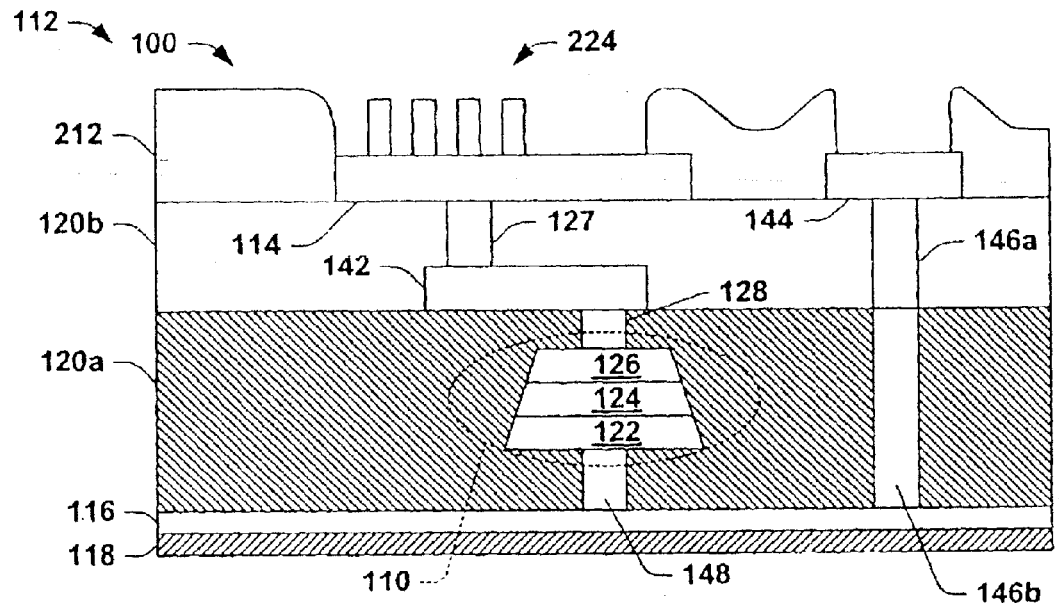
FIG. 13 is side elevation view in section, illustrating the wafer of FIG. 12 following removal of the remaining resist.

The invention may also be employed to measure plasma charging associated with a dielectric etch operation, as illustrated in FIGS. 11–13. For example, beginning with the wafer 112 of FIG. 10, the polarity of the FE capacitor 110 is preprogrammed (e.g., as in FIG. 5) and a resist coating is applied over the dielectric layer 212, which is subsequently patterned to leave a patterned resist 222, as illustrated in FIG. 11. Thereafter, referring to FIG. 12, a patterned dielectric etch operation 220 is performed on the semiconductor wafer 112. The residual resist 222 (not shown) is then removed, leaving patterned dielectric material 224 remaining from the initial dielectric layer 212, as illustrated in FIG. 13. The post processing polarity of the FE capacitor 110 is then measured or detected, for example, as illustrated in FIG. 6, and a determination is made as to whether the process related charging due to the dielectric etch operation 220 exceeded a predetermined value.

Figure 14:
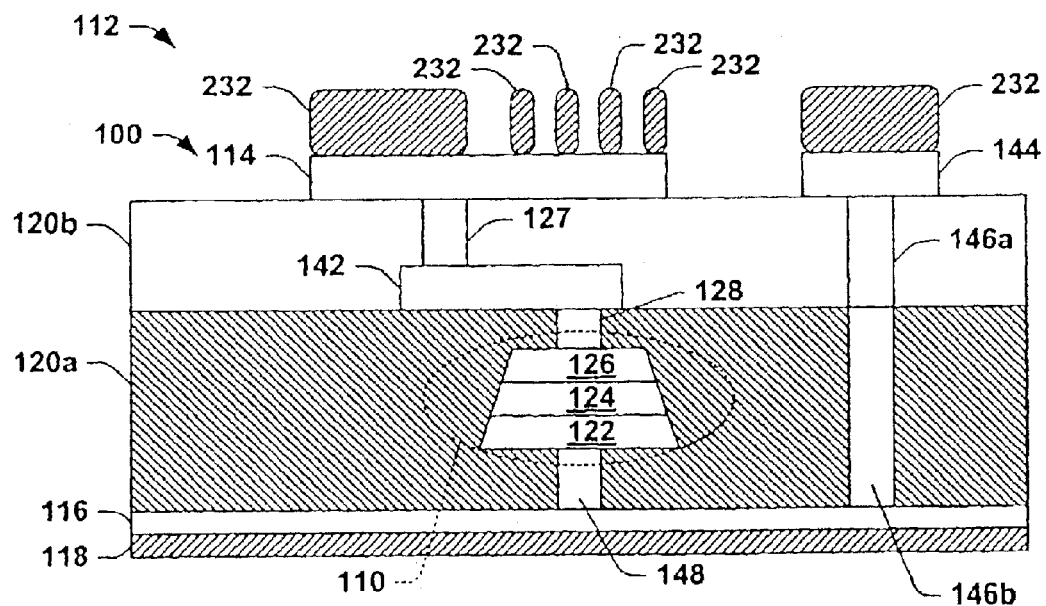
FIG. 14 is side elevation view in section, illustrating the wafer of FIG. 2 with a patterned resist prior to metal etching.
Figure 15:
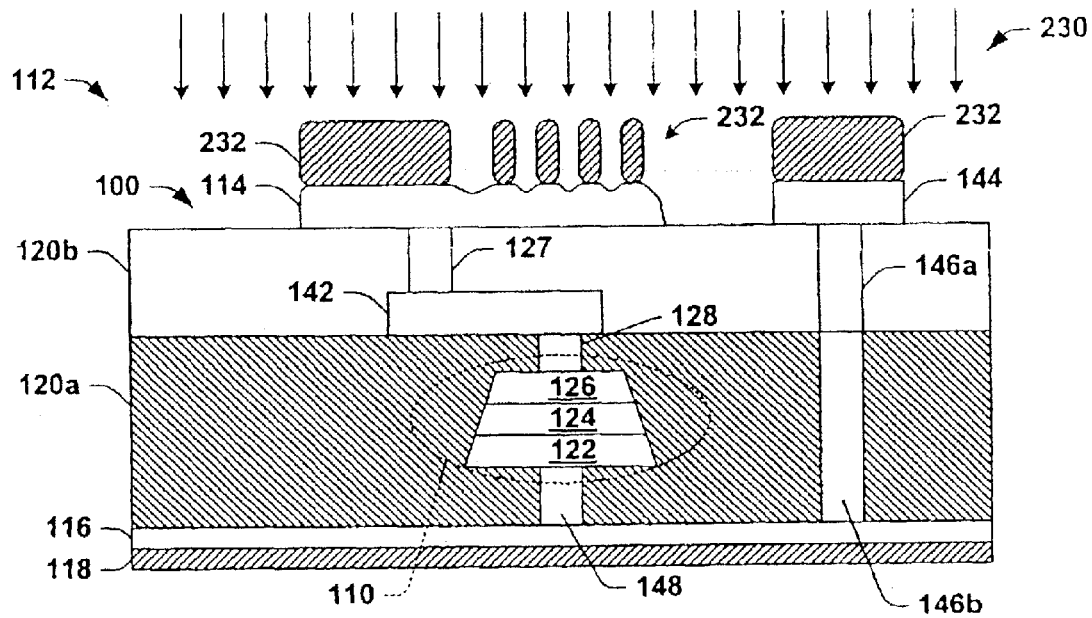
FIG. 15 is side elevation view in section, illustrating the wafer of FIG. 14 undergoing a metal etch operation.
Figure 16:
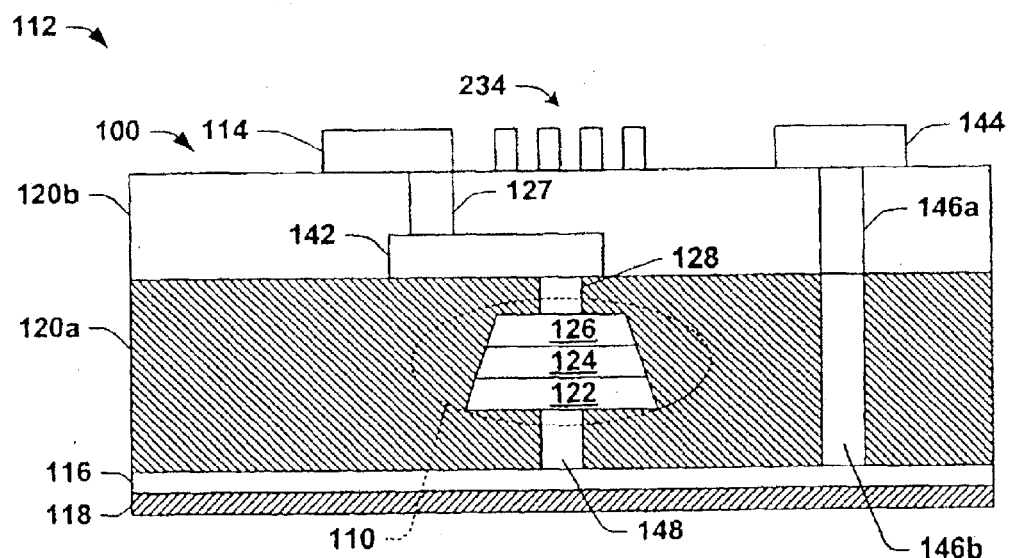
FIG. 16 is side elevation view in section, illustrating the wafer of FIG. 15 following metal etching and removal of remaining resist.

Yet another application of the invention is illustrated in FIGS. 14–16, wherein the charging effects of a metal etch operation are monitored. Beginning with the wafer 112 of FIG. 2, the polarity of the FE capacitor 110 is preprogrammed (e.g., as in FIG. 5) and a resist coating (not shown) is applied over the top surface of the wafer 112. The resist coating is subsequently patterned to leave a patterned resist 232, as illustrated in FIG. 14. Using this patterned mask 232, a patterned metal etch operation 230 is performed as illustrated in FIG. 15 and the remaining resist (not shown) is removed. The resulting structure is illustrated in FIG. 16, wherein the wafer 112 comprises a portion of the initial metal conductive antenna 114, the probe pad 144, and patterned metal structures 234 overlying the FE capacitor 110. Thereafter, the post processing polarity of the FE capacitor 110 in the monitor 100 can be measured (e.g., as in FIG. 6), to determine whether the charging related to the metal etch operation 230 exceeded a predetermined value.

Figure 22:
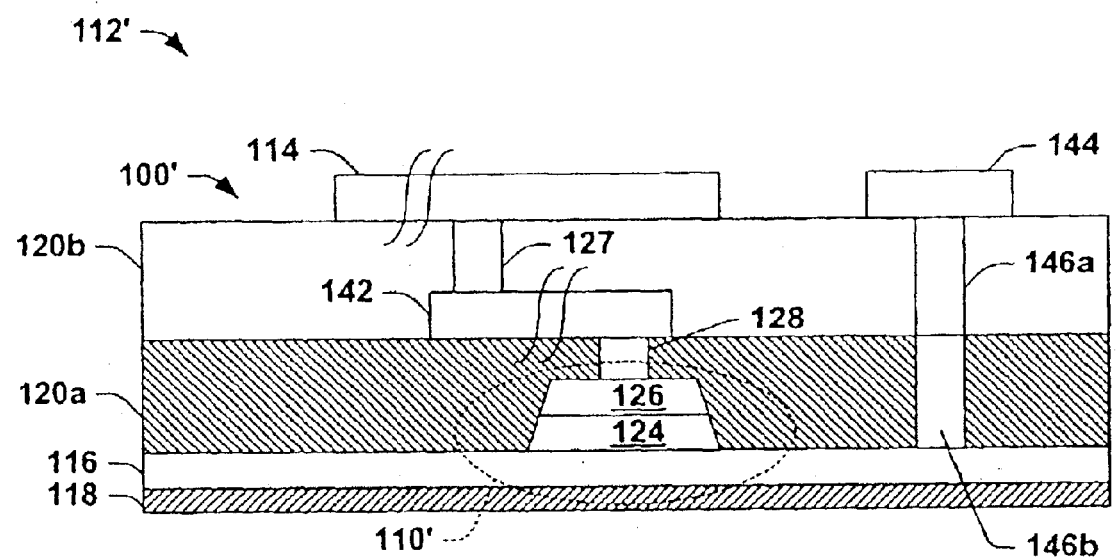
FIG. 22 is a side elevation view in section, illustrating another exemplary ferroelectric capacitor plasma charging monitor formed in a semiconductor wafer in accordance the present invention.

Referring briefly to FIG. 22, other structures for plasma charging monitors are possible within the scope of the present invention, apart from that of the device 100 of FIGS. 2–16. One such alternate implementation is illustrated in FIG. 22, wherein a wafer 112' comprises a plasma charging monitor 100', having an antenna 114, a polysilicon resistor 142, a probe pad 144, and a ferroelectric capacitor 110'. Unlike the FE capacitor 110 illustrated and described above, the lower electrode of the FE capacitor 110' is formed from the metal layer 116 overlying the substrate 118. The device 100' operates in similar fashion to the plasma charging monitor 100 illustrated and described above, and further may require less processing steps or operations to fabricate. Still other implementations of ferroelectric capacitor plasma charging monitor structures apart from those specifically illustrated and described herein are contemplated as falling within the scope of the present invention.

Referring now to FIGS. 17–21, another aspect of the invention relates to methods for monitoring plasma related charging in semiconductor devices, by which the shortcomings associated with prior (e.g., EEPROM type) sensors can be mitigated or overcome. FIGS. 17–21 illustrate several such methods. Although the exemplary methods are illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems not illustrated.

Figure 17:
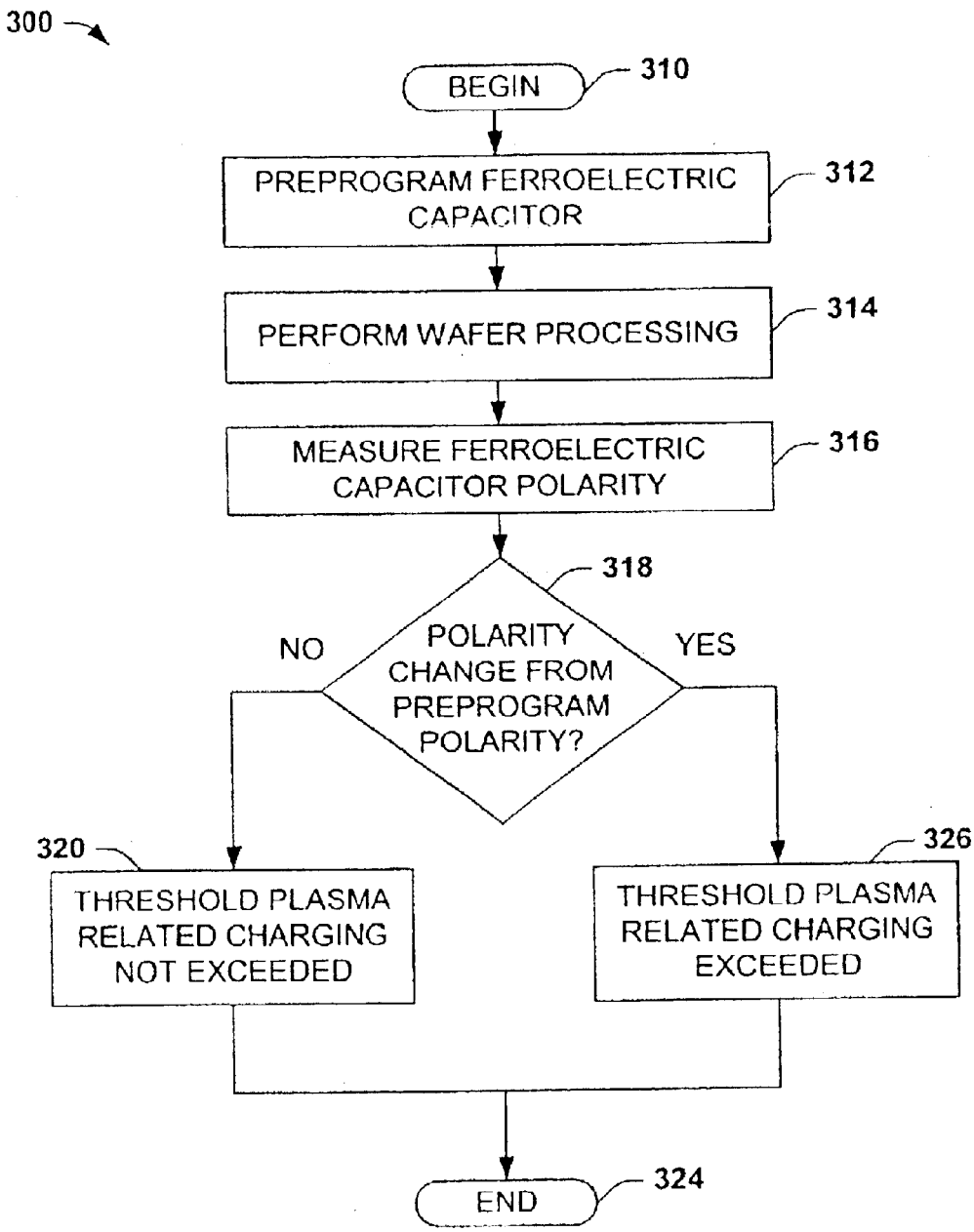
FIG. 17 is a flow diagram illustrating an exemplary method of monitoring plasma related charging in a semiconductor wafer in accordance with another aspect of the present invention.

An exemplary method 300 for monitoring plasma charging in semiconductor device manufacturing is illustrated in FIG. 17, beginning at 310. At 312, a ferroelectric capacitor, such as the FE capacitor 110 of the wafer 122 in FIG. 5, is precharged or preprogrammed to attain a first polarity. Thereafter at 314, one or more wafer processing steps or operations (e.g., for example an implantation operation, a resist ashing operation, a dielectric deposition operation, a dielectric etch operation, and/or a metal etch operation) are performed on the wafer. Following such processing, the polarity of the FE capacitor is measured at 316, and a determination is made at 318 as to whether a polarity change has occurred as a result of the wafer processing at 314. If not, an indication is provided at 320 that the plasma charging did not exceed a predetermined threshold, before the method 300 ends at 324. If, however, the FE capacitor polarity changed at 318, an indication is provided at 326 that the plasma charging exceeded the threshold for the FE capacitor, whereafter the method 300 ends at 324.

Figure 18:
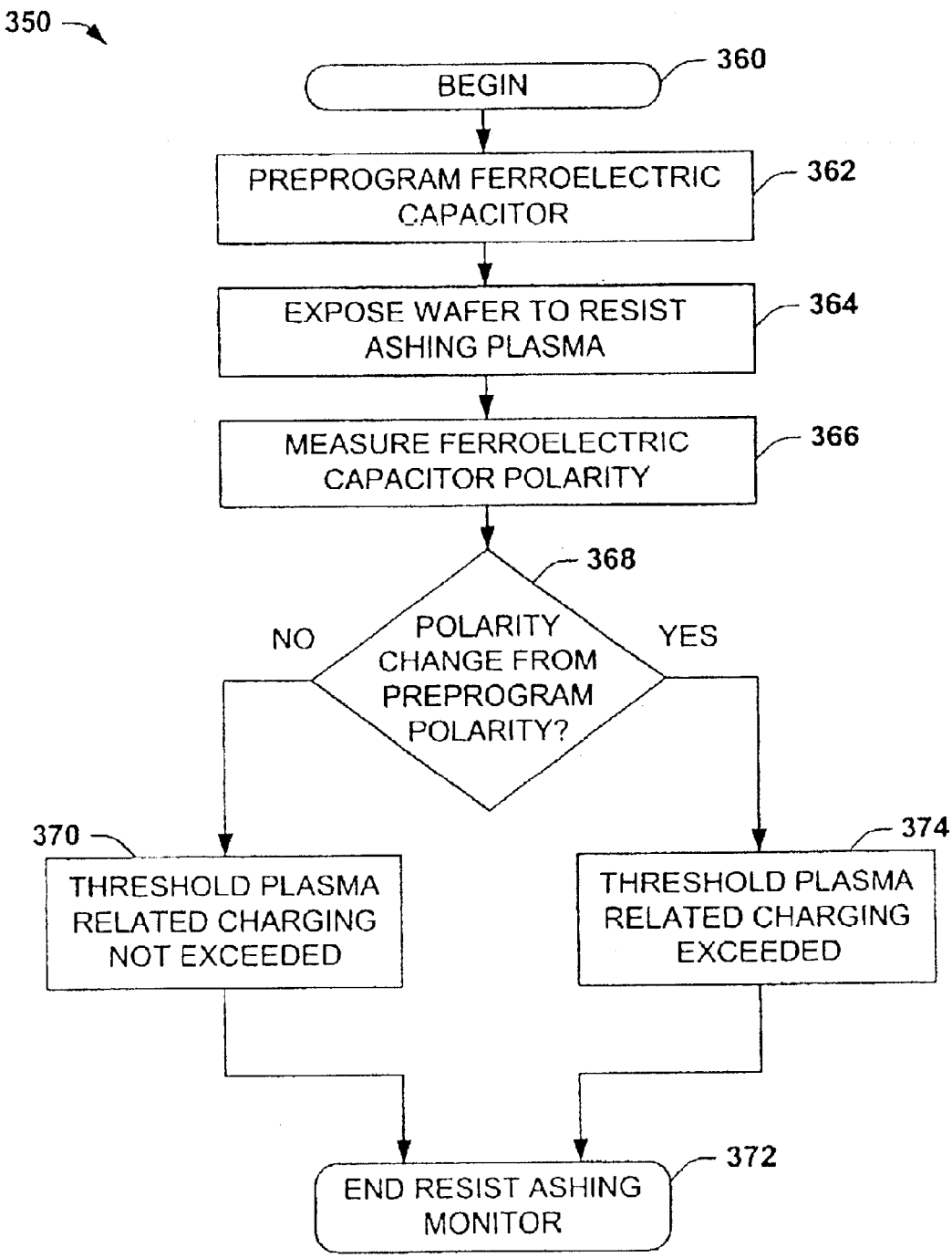
FIG. 18 is a flow diagram illustrating another exemplary method of monitoring plasma related charging associated with a resist ashing operation in accordance with the invention.

Another exemplary method 350 is illustrated in FIG. 18, for monitoring plasma charging related to resist ashing. Beginning at 360, a ferroelectric capacitor is preprogrammed at 362 to a first polarity. Thereafter at 364, the wafer is exposed to a resist ashing plasma. The FE capacitor polarity is then measured at 366, and a determination is made at 368 as to whether a polarity change has occurred as a result of the resist ashing process at 364. If not, an indication is provided at 370 that the plasma charging did not exceed a predetermined threshold, before the method 350 ends at 372. If, however, the FE capacitor polarity changed at 368, an indication is provided at 374 that the plasma charging resulting from the resist ashing operation exceeded the threshold for the FE capacitor, whereafter the method 350 ends at 372.

Figure 19:
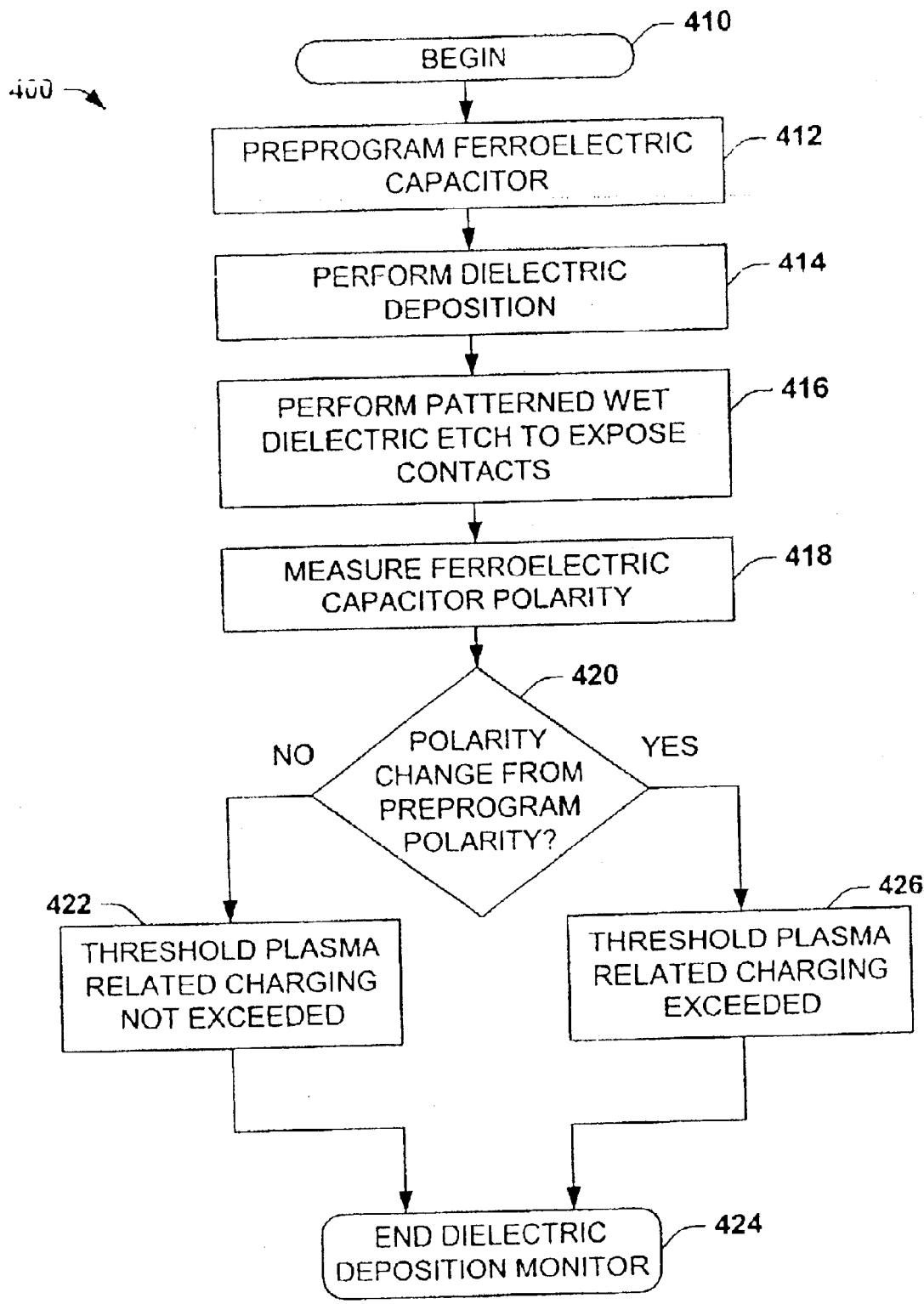
FIG. 19 is a flow diagram illustrating another exemplary method of monitoring plasma related charging associated with a dielectric deposition operation in accordance with the invention.

The techniques of the invention may also be applied with respect to dielectric deposition operations involving plasma and the wafer charging resulting therefrom. An exemplary method 400 is illustrated in FIG. 19, for monitoring plasma charging related to such deposition processing. Beginning at 410, a ferroelectric capacitor is preprogrammed at 412 to a first polarity. Thereafter at 414, the wafer is exposed to a dielectric deposition process, and a patterned wet etch is performed at 416 so as to expose measurement contacts associated with the FE capacitor (e.g., antenna 114 and probe pad 144 of FIG. 10). The polarity of the FE capacitor is then measured at 418, and a determination is made at 420 as to whether a polarity change has occurred as a result of the dielectric deposition at 414. If not, an indication is provided at 422 that the plasma charging did not exceed a predetermined threshold, before the method 400 ends at 424. If, however, the FE capacitor polarity changed at 420, an indication is provided at 426 that the plasma charging exceeded the threshold for the FE capacitor, whereafter the method 400 ends at 424.

Figure 20:
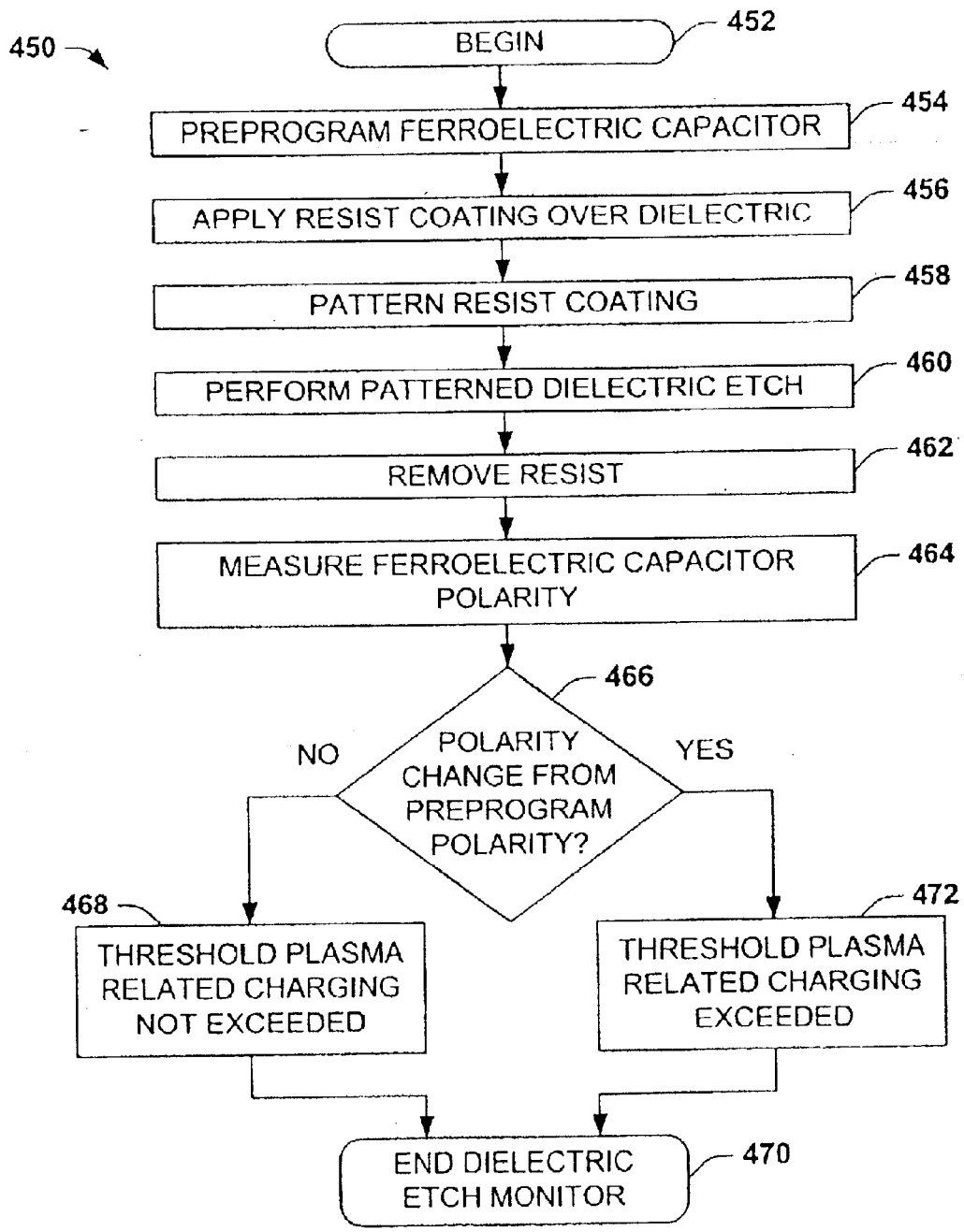
FIG. 20 is a flow diagram illustrating another exemplary method of monitoring plasma related charging associated with a dielectric etching operation in accordance with the invention.

Referring now to FIG. 20, the methodologies of the invention may further be employed in monitoring plasma charging associated with dielectric etch operations involving plasma, such as plasma dry etching. An exemplary method 450 in FIG. 19 begins at 452, after which an FE capacitor is preprogrammed at 454. At 456, a resist coating is applied over a dielectric layer on the wafer, which is then patterned at 458. A patterned dielectric etch operation is then performed at 460 and the remaining resist is removed at 462. The polarity of the FE capacitor is then measured at 464, and a determination is made at 466 as to whether a polarity change has occurred as a result of the dielectric etching operation at 460. If not, an indication is provided at 468 that the plasma charging did not exceed a predetermined threshold, before the method 450 ends at 470. Otherwise (e.g., the FE capacitor polarity changed at 466), an indication is provided at 472 that the plasma charging exceeded the threshold for the FE capacitor, whereafter the method 450 ends at 470.

Figure 21:
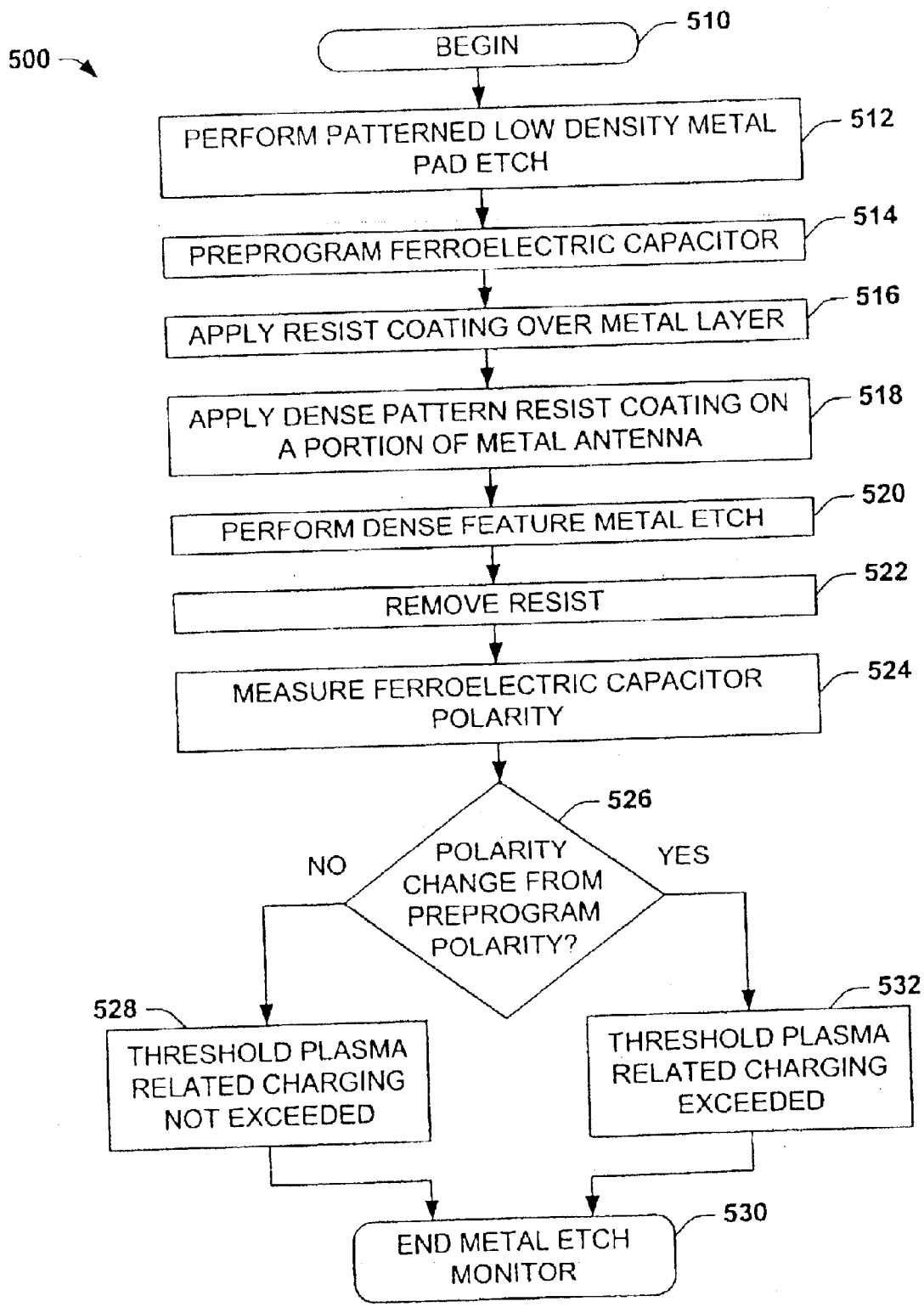
FIG. 21 is a flow diagram illustrating another exemplary method of monitoring plasma related charging associated with a metal etching operation in accordance with the invention.

As illustrated in FIG. 21, the invention may also be employed in monitoring plasma charging associated with metal etching operations performed on semiconductor wafers. A method 500 is illustrated in FIG. 21 beginning at 510, wherein a patterned low density metal etch operation is performed at 512 in order to expose the contacts (e.g., antenna 114 and probe pad 144), and an FE capacitor is preprogrammed at 514. At 516, a resist coating is applied over a metal layer on the wafer, which is then patterned at 518 using a dense pattern. A metal etch operation is then performed at 520, such as a dense feature metal etch employing a plasma, and the remaining resist is removed at 522. The polarity of the FE capacitor is then measured at 524, and a determination is made at 526 as to whether a polarity change has occurred as a result of the metal etching at 520. If not, an indication is provided at 528 that the plasma charging did not exceed a predetermined threshold, before the method 500 ends at 530. Otherwise, an indication is provided at 532 that the plasma charging in the etching operation of 520 exceeded the threshold for the FE capacitor, whereafter the method 500 ends at 530.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of monitoring plasma related charging of a semiconductor wafer, comprising:
   preprogramming a ferroelectric capacitor in the semiconductor wafer to a preprogrammed polarity;
   performing a processing operation on the semiconductor wafer, wherein the ferroelectric capacitor is exposed to the processing operation;
   measuring a post-processing polarity associated with the ferroelectric capacitor after the processing operation; and
   determining a plasma related charging associated with the processing operation according to the measured post-processing polarity.

2. A method of monitoring plasma related charging of a semiconductor wafer, comprising:
   preprogramming a ferroelectric capacitor in the semiconductor wafer;
   performing a processing operation on the semiconductor wafer, wherein the ferroelectric capacitor is exposed to the processing operation;
   measuring a polarity associated with the ferroelectric capacitor;
   determining a plasma related charging associated with the processing operation according to the measured polarity;
   forming the ferroelectric capacitor over the semiconductor wafer, wherein the ferroelectric capacitor comprises a bottom conductive electrode, a ferroelectric material overlying the bottom electrode, and a top conductive electrode overlying the ferroelectric material;
   forming a conductive antenna over the semiconductor wafer, wherein at least a portion of the antenna is exposed so as to allow connection to external instruments;
   forming a resistor over the semiconductor wafer;
   electrically connecting the top conductive electrode to the conductive antenna using the resistor;
   forming a conductive probe pad over the semiconductor wafer, wherein at least a portion of the probe pad is exposed so as to allow connection to external instruments; and
   electrically connecting the conductive probe pad to the bottom conductive electrode.

3. The method of claim 2, wherein preprogramming the ferroelectric capacitor comprises:
   connecting a first terminal of a preprogramming source to an exposed portion of the conductive antenna;
   connecting a second terminal of the preprogramming source to an exposed portion of the conductive probe pad; and
   applying a voltage across the first and second terminals using the preprogramming source in order to charge the ferroelectric capacitor to a first polarity, wherein the first polarity is opposite an expected polarity of the plasma related charging.

4. The method of claim 2, wherein measuring a polarity associated with the ferroelectric capacitor comprises:
   connecting a first terminal of a polarity detector instrument to an exposed portion of the conductive antenna;
   connecting a second terminal of the polarity detector instrument to an exposed portion of the conductive probe pad; and
   measuring the polarity associated with the ferroelectric capacitor using the polarity detector instrument; and
   wherein determining the plasma related charging associated with the processing operation comprises determining that the plasma related charging exceeded a first charging level if the measured polarity is different from the preprogrammed polarity.

5. The method of claim 2, wherein performing a processing operation on the semiconductor wafer comprises performing one of an implantation operation, a resist ashing operation, a dielectric deposition operation, a dielectric etch operation and a metal etch operation on the semiconductor wafer.

6. A method of monitoring plasma related charging of a semiconductor wafer, comprising:
   preprogramming a ferroelectric capacitor in the semiconductor wafer;
   performing a processing operation on the semiconductor wafer, wherein the ferroelectric capacitor is exposed to the processing operation;
   measuring a polarity associated with the ferroelectric capacitor; and
   determining a plasma related charging associated with the processing operation according to the measured polarity;
   wherein performing a processing operation on the semiconductor wafer comprises exposing the semiconductor wafer to a resist ashing plasma.

7. The method of claim 1, wherein performing a processing operation on the semiconductor wafer comprises:
   performing a dielectric deposition operation on the semiconductor wafer; and
   performing a patterned wet dielectric etch operation on the semiconductor wafer.

8. The method of claim 1, wherein performing a processing operation on the semiconductor wafer comprises:
   applying a resist coating over a dielectric layer associated with the semiconductor wafer;
   patterning the resist coating;
   performing a patterned dielectric etch operation on the patterned resist coated semiconductor wafer; and
   removing the resist coating.

9. The method of claim 1, wherein performing a processing operation on the semiconductor wafer comprises:
   applying a resist coating over a metal layer associated with the semiconductor wafer;

patterning the resist coating;

performing a patterned metal etch operation on the patterned resist coated semiconductor wafer; and removing the resist coating.

10. A method of fabricating a plasma charging monitor for monitoring plasma related charging in a semiconductor manufacturing process, the method comprising:

providing a semiconductor wafer;

forming a ferroelectric capacitor over the semiconductor wafer having first and second electrodes;

forming an antenna electrically connected to the first electrode over the semiconductor wafer with at least a portion of the antenna exposed to provide electrical connection thereof with an external device; and forming a probe pad electrically connected to the second electrode over the semiconductor wafer with at least a portion of the probe pad exposed to provide electrical connection thereof with the external device.

11. The method of claim 10, further comprising forming a resistor associated with the semiconductor wafer and electrically connecting the first electrode to the antenna through the resistor.

12. The method of claim 11, wherein forming the ferroelectric capacitor comprises:

forming the second electrode over the semiconductor wafer;

forming a ferroelectric material overlying the second electrode; and forming the first electrode overlying the ferroelectric material over the semiconductor wafer.

13. The method of claim 12, wherein forming the ferroelectric material comprises forming at least one of PZT, SBT, and BLT overlying the second electrode.

14. The method of claim 12, wherein forming the resistor in the semiconductor wafer comprises:

forming a polysilicon material over the semiconductor wafer;

forming a lower conductive portion extending between and electrically connecting the polysilicon material to the first electrode over the semiconductor wafer; and forming an upper conductive portion extending between and electrically connecting the polysilicon material to the antenna over the semiconductor wafer.

15. The method of claim 12, comprising forming a first conductive plug extending between and electrically connecting the probe pad and the second electrode.

16. The method of claim 10, wherein forming the ferroelectric capacitor comprises:

forming the second electrode over the semiconductor wafer;

forming a ferroelectric material overlying the second electrode; and forming the first electrode overlying the ferroelectric material over the semiconductor wafer.

* * * * *